(12) United States Patent
Pai

(10) Patent No.: US 9,385,508 B2
(45) Date of Patent: Jul. 5, 2016

(54) CONTROL OF SPATIAL MODE DISTRIBUTION OF A LARGE-CORE LASER DIODE SYSTEM

(71) Applicant: Mieng Pai, Bellingham, WA (US)

(72) Inventor: Mieng Pai, Bellingham, WA (US)

( * ) Notice: Subject to any disclaimer, the term of this patent is extended or adjusted under 35 U.S.C. 154(b) by 0 days.

(21) Appl. No.: 14/339,103

(22) Filed: Jul. 23, 2014

(65) Prior Publication Data

US 2015/0030041 A1 Jan. 29, 2015

Related U.S. Application Data

(60) Provisional application No. 61/859,168, filed on Jul. 26, 2013.

(51) Int. Cl.
| | |
|---|---|
| H01S 5/14 | (2006.01) |
| H01S 3/08 | (2006.01) |
| H01S 3/083 | (2006.01) |
| H01S 3/106 | (2006.01) |
| H01S 5/20 | (2006.01) |
| H01S 5/40 | (2006.01) |

(52) U.S. Cl.
CPC .............. *H01S 5/141* (2013.01); *H01S 3/083* (2013.01); *H01S 3/0805* (2013.01); *H01S 3/1062* (2013.01); *H01S 5/2036* (2013.01); *H01S 5/4006* (2013.01); *H01S 2301/166* (2013.01)

(58) Field of Classification Search
CPC ..... H01S 5/141; H01S 5/4006; H01S 3/1062; H01S 3/083; H01S 3/0805
USPC .................. 372/9, 15, 20, 25, 29.02
See application file for complete search history.

(56) References Cited

U.S. PATENT DOCUMENTS

| | | | |
|---|---|---|---|
| 2004/0165641 A1 | 8/2004 | Garnache et al. | |
| 2006/0215713 A1* | 9/2006 | Flanders et al. | 372/20 |
| 2012/0307242 A1* | 12/2012 | Locklin et al. | 356/326 |

OTHER PUBLICATIONS

International Search Report and The Written Opinion of the International Searching Authority for PCT/US14/47941; Mailing Date Nov. 28, 2014; pp. 1-18.

* cited by examiner

*Primary Examiner* — Dung Nguyen
(74) *Attorney, Agent, or Firm* — Yakov Sidorin; Quarles & Brady, LLP

(57) ABSTRACT

System and method for operating a single unit of light-amplifying medium, structured to produce light with a complex spatial spectrum including multitude of high-order spatial modes, in external cavity configured, in conjunction with an optical etalon installed intra-cavity, to reduce spatial spectrum of such light to provide an output containing smaller number of high-order spatial modes and, optionally, only the lowest spatial mode at power levels on the order of 1 W or higher (for example, tens or hundreds of Watts).

20 Claims, 10 Drawing Sheets

FIG. 1
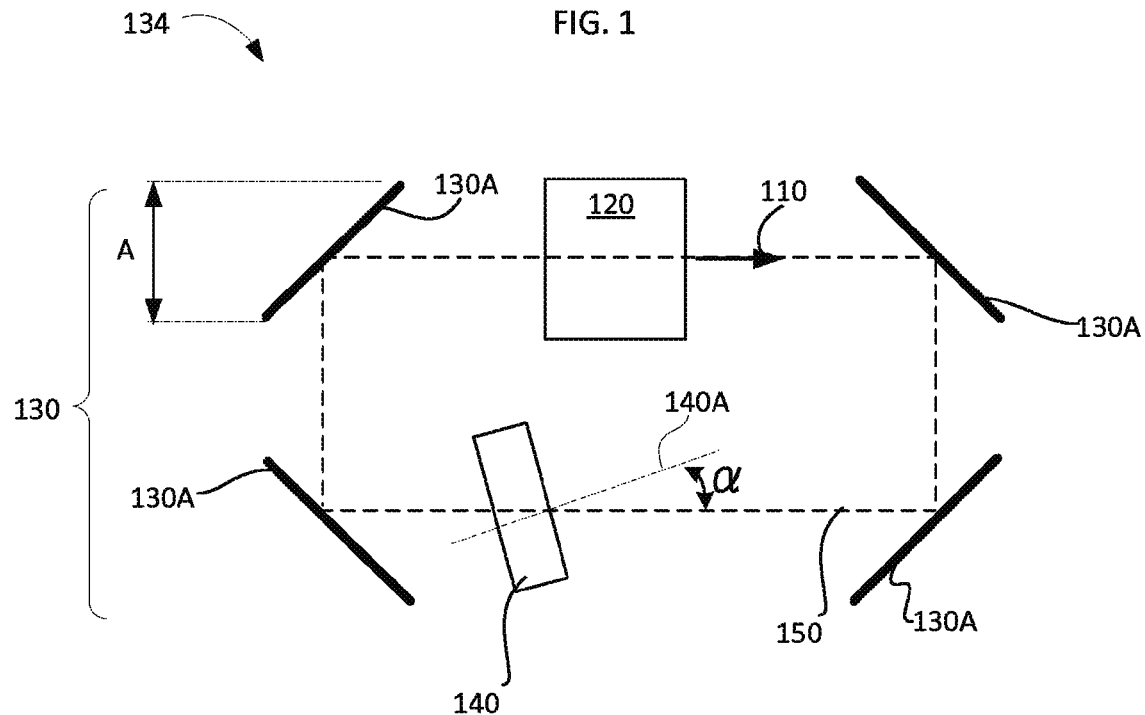
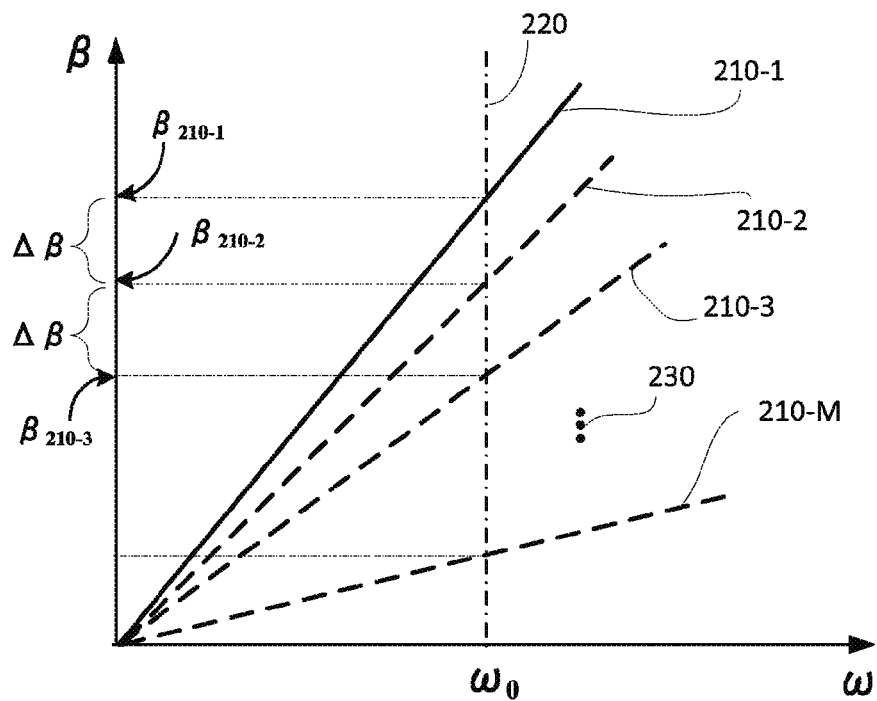
FIG. 2A

CONTROL OF SPATIAL MODE DISTRIBUTION OF A LARGE-CORE LASER DIODE SYSTEM

CROSS REFERENCE TO RELATED APPLICATIONS

The present application claims priority from and benefit of U.S. Provisional Patent Application No. 61/859,168 filed on Jul. 26, 2013 and titled "High Brightness Laser Diodes Using a Large Active Core With External Cavity Mode Control (Frequency-Number Selection)". The disclosure of the above-identified provisional patent application is incorporated herein by reference.

TECHNICAL FIELD

The present invention relates to control of spatial spectrum of a laser-diode system and, more particularly, to an external-cavity system employing a large-core laser diode chip and method of operation of the same configured such that the spatial spectrum of the light-output of such system is less complex than the spatial spectrum of light that the large-core laser diode chip is configured to generate on its own.

BACKGROUND

Low-power laser diode (LD) systems, i.e. those that employ LDs configured to generate light output in the range of milliWatts, generally utilize LDs having small-size active regions or cores. The small dimensions of an active region of such LD are chosen intentionally, to ensure that the light output from such laser contains only one spatial mode (typically, the lowest spatial mode) to facilitate further processing of the laser beam such as, for example, to simplify the process of coupling of the laser output into a single-mode optical fiber or waveguide. A LD with a small active region is known to suffer from heating issues (often resulting in material thermal damage) when the operation of such LD is scaled up to satisfy a need in high output power. At the same time, the use of LD chips with spatially large active regions or cores, which structurally are capable of generating high output optical power is generally ruled out because, understandably, LDs with active region waveguides that are sufficiently large support spatially-multimode operation, which is not desirable from the point of view of efficient utilization of the laser output. As a result, a high power LD system is typically structured as an array of laser sources containing small-core emitter arrays, which is known as a diode bar or stack. The array is typically designed such that individual optical fields generated by the individual emitter-components of the array are coupled to form a total optical field characterized both by high power and desired beam quality.

There remains a need for a laser diode system that utilizes output power advantages provided by a LD with a large active region but yet maintains the desired quality of the output beam.

SUMMARY

An embodiment of the present invention provides a method for controlling a transverse distribution of light generated by a light-amplifying medium (LAM) at an operational wavelength. Such method includes operating the LAM within an external cavity (EC), which is configured as a loop cavity such as to produce first light output at the operational wavelength. The said loop cavity is defined by at least three mirrors at least one of which is dimensioned to ensure that a first angle is smaller than a second angle. The loop cavity may be shaped as a polygon (in a plane) or as a loop having extent in all three dimensions. The first angle defined as an angle formed between a line connecting (i) a first point defined on a perimeter of a clear aperture of one mirror of the EC with (ii) a second point on a perimeter of a clear aperture of a neighboring mirror of the EC, and a portion of an optical axis of said EC that connects these neighboring mirrors. The second angle is determined based on a non-zero angle at which light, incident onto the optical etalon filter from one mirror, constructively interferes with itself upon interaction with the optical etalon such as to propagate towards the next mirror. The method further includes impinging light generated by LAM onto an optical etalon filter that is disposed intracavity across a cavity axis between these two neighboring mirrors. The impinging light onto the etalon filter may include transmitting light through such filter that has been disposed intracavity with a reflector of such filter being perpendicular to the cavity axis, and transmitting light through an intra-cavity optical isolator.

In particular, the step of impinging may include impinging light onto an optical etalon structured such that first spatial spectrum of first light, which has been formed as a result of interaction with light generated by LAM with the optical etalon, is different from spatial spectrum of light generated by the LAM. The method may additionally include transmitting light from a seed laser source located outside the EC through the LAM along the cavity axis. In a specific case, such transmitting may include tuning an operational wavelength of said seed laser. Alternatively or in addition, the method may include tuning optical length of said optical etalon filter and/or transmitting light, generated by the LAM operated within the EC, through an optical isolator positioned between two mirrors of the EC. The method may also include varying a clear aperture of one or more of the at least three mirrors (in one implementation—by varying an opening of an aperture juxtaposed with a mirror of the EC). The method may further include a step of varying current applied to said LAM.

The step of operating the LAM may include operating a laser diode (LD) chip under chosen operating conditions within the EC such that the first light output includes a laser output containing a first number of transverse modes, which number is smaller than a second number of transverse modes generated by a laser diode that includes said LD chip and that is operated under said operating conditions without EC. In a specific embodiment, the first light output may include only a fundamental transverse mode. The first light output may be further impinged onto an element disposed outside the EC.

Embodiments further provide a laser system configured to generate first light at an operational wavelength. The laser system includes: a loop optical cavity formed by at least three mirrors and cavity having an optical axis; a light amplifying medium (LAM) disposed coaxially with the optical axis inside the loop optical cavity such that the loop optical cavity forms an external cavity (EC) with respect to the LAM; and an optical etalon filter disposed intra-EC across the optical axis. One or more mirrors of the at least three mirrors is dimensioned to ensure that a first angle is smaller than a second angle. Here, the first angle is defined as an angle formed between a) a cavity line that connects (i) a first point defined on a perimeter of a clear aperture of a first mirror of the EC with (ii) a second point on a perimeter of a clear aperture of a second mirror of the EC; and b) a portion of the optical axis that connects these two mirrors. The second angle is determined based on a non-zero angle at which light, that is incident on the optical etalon filter intracavity from one mirror, constructively interferes with itself upon interaction with the optical etalon such as to propagate towards another second mirror. The optical etalon filter may include a tunable Fabry-Perot Etalon (FPE), in which case the laser system further contains a tuner operably connected to the FPE to change its optical length. The optical etalon filter is structured inside the EC such that the second light formed as a result of interaction of first light with the optical etalon filter has spatial spectrum that is different from the spatial spectrum of the first light. The laser system may include a seed laser disposed outside of the EC to generate a beam of light at the operational wavelength such that, when this beam of light is coupled into the EC, it propagates through the LD chip along the optical axis. A laser system may additionally include an aperture configured to have a variable dimension and positioned such as to change a clear aperture of a mirror of the EC in response to changing this variable dimension. This variable aperture may be dimensioned such that spatial distribution of light output from the laser system includes only a fundamental transverse mode. The loop cavity may be a polygon or extend in all three dimensions, and further include an intracavity optical isolator.

Embodiments of the invention further include a laser system that contains a) a laser diode (LD) chip disposed in an external cavity (EC) defined by at least three mirrors; b) an optical etalon and an optical isolator positioned in the EC; and c) a seed laser configured outside of the EC such as to transmit light that has been generated at an operational wavelength by the seed laser through a seed mirror of the EC and through said LD chip. (The LD chip is structured to generate N transverse modes at said operational wavelength when operated as a single-chip laser diode, without the EC.) The EC forms a closed loop and is judiciously structured such that light incident from a first mirror onto the optical etalon at a largest angle (defined as an angle at which light at the operational wavelength is supported to circulate in the EC) does not propagate towards a second mirror of the EC. When operating at the operational wavelength, the laser system generates light forming a light output that contains M transverse modes, M<N.

The laser system may optionally contain an adjustable aperture operably juxtaposed with a mirror of the EC such as to vary a clear aperture of said mirror and/or a polarizer disposed across the optical axis inside the EC. The laser system may include a LD chip having an active region with a cross-sectional area of at least several tens of square microns (optionally—in excess of 1,000 square microns) and structured such that the light output includes only a $TEM_{00}$ spatial mode with power exceeding 1 W.

Embodiments of the invention further provide a computer program product for use on a computer system for controlling operational characteristics of an external-cavity (EC) laser system employing a single large-core laser diode (LD) chip. The computer program product contains a tangible non-transitory computer usable storage medium having computer readable program code thereon. The computer readable program code includes: a) program code for modifying a size of an opening of a variable aperture juxtaposed against a working surface of a mirror of the EC, that forms an optical path defined by a closed loop; and (b) program code for varying a parameter of electrical feed supplied to the LD chip. Additional program codes included into the computer readable program code may include one or more of i) program code for controlling an optical parameter of an optical etalon disposed inside the EC, wherein the optical etalon is structured to form, as a result of interacting with light incident thereon, another light having spatial spectrum that is reduced in comparison with the spatial spectrum of incident light; (ii) program code for controlling an operational parameter of a seed laser operably cooperated with the LD chip outside of the EC; (iii) program code for varying an operational parameter of an optical isolator disposed across the optical path; (iv) program code for calculating a parameter of angular bandwidth of the optical etalon based at least on an operation parameter of the seed laser and chosen geometrical parameter of the EC.

BRIEF DESCRIPTION OF THE DRAWINGS

The invention will be more fully understood by referring to the following Detailed Description of Specific Embodiments in conjunction with the generally not-to scale and exaggerated Drawings, of which:

FIG. 1 is a diagram illustrating an external cavity structure around a light-amplifying medium and including an optical etalon structured according to an embodiment of the invention;

FIG. 2A is a plot schematically representing plane-waves defining spatial spectrum of light constructively interfering upon interaction with the optical etalon such as to continue to propagate within the external cavity of FIG. 1;

Figure 2B:
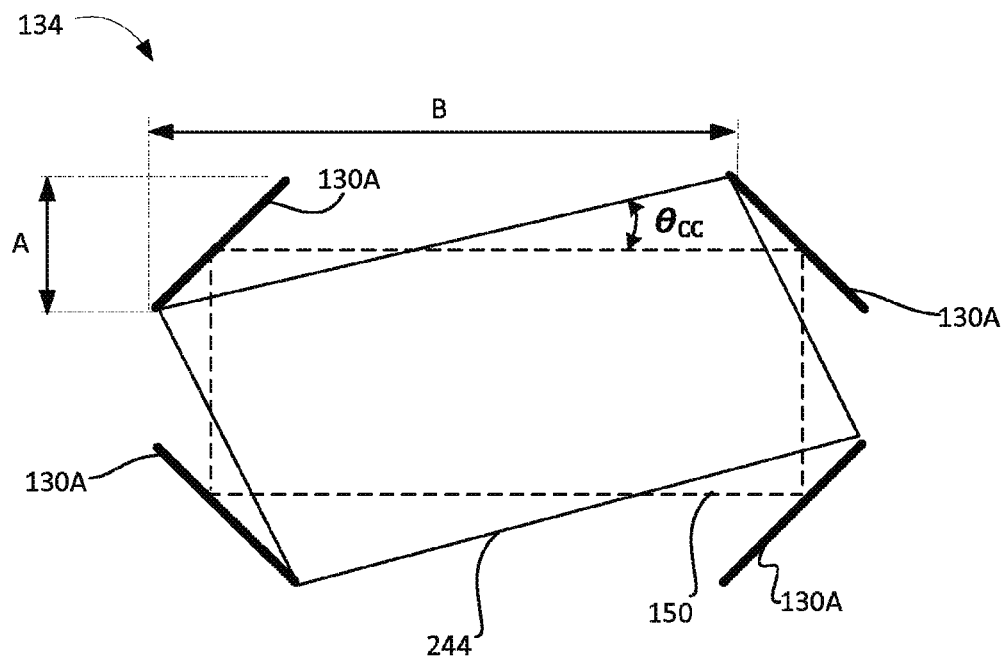
FIG. 2B is a diagram illustrating the calculation of a cavity critical angle.

Generally, the sizes and relative scales of elements in the Drawings may be set to be different from actual ones to appropriately facilitate simplicity, clarity, and understanding of the Drawings. For the same reason, not all elements present in one Drawing may necessarily be shown in another.

DETAILED DESCRIPTION

In accordance with preferred embodiments of the present invention, methods and apparatus are disclosed that utilize a single, the only unit of light-amplifying medium (LAM) such as an LAM chip, the light-amplifying region of which has a cross-section sufficiently large to support a large number of high-order spatial or transverse modes, in a specific fashion in which the light output from the apparatus carries high optical power comparable with that produced by typical laser-diode stacks and, at the same time, contains a number of spatial modes that is lower than the number of spatial modes that the LAM chip is configured to generate on its own. In a specific implementation, the apparatus and methods of the invention are configured to generate a lowest spatial mode laser light output (the TEM$_{00}$ mode, for example) at high optical power that is desired for applications such as optical-fiber-based telecommunications, material processing, free-space optical displays, medical diagnostics, and free-space optical communications, to name just a few. The idea of the present invention stems from the realization that control of content of spatial light distribution amplified by the single, stand-alone LAM can be effectuated with the use of a judiciously structured combination of the EC and an optical etalon filter inside such EC.

The problem of reduction of the number of plane waves (the combination of which represents an overall spatial distribution of light that a given LAM is structured to amplify) is solved by excluding the identified plane-waves from propagating through the LAM. The exclusion of these plane-waves is carried out based at least in part on angles of propagation that exceed a threshold angle of propagation defined with respect to an optical axis, by positioning the LAM in an appropriately structured EC containing an intra-EC optical etalon that is configured to filter out a first set of plane-waves, and additional sizing of a mirror of the EC to filter out a second set of plane-waves such that only a target set of plane waves (defined with respect to the predetermined threshold angle) remains to circulate within the EC.

The specific problem of reduction of the number of spatial modes generated by a high-power LD chip having a large active region that supports, in operation of the LD, multiple spatial modes, is solved by operating the chip in an external cavity that is equipped with (i) an internal optical etalon and (ii) a mirror (dimension(s) of which are specifically chosen based on an operational parameter of this internal optical etalon) such as to provide an unidirectional circulation of light inside the cavity and to not allow light in defined high-order spatial modes, chosen to be eliminated from the spatial spectrum of the LD, contribute an output from such external cavity laser system.

The problem of providing a high-power, lowest-order spatial mode light output from an edge-emitting laser diode chip (that is structured to support multiple spatial modes) is solved by operating such chip in an external cavity (EC) laser system, in which such EC is configured to form a loop and is defined by mirrors a clear aperture of at least one of which is judiciously chosen to controllably define the spatial distribution of light circulating within the EC contemporaneously with controllably purifying the spatial mode distribution by selecting a direction of light waves propagating intra-cavity with an optical etalon positioned intra-cavity and/or limiting the direction of circulation of light waves intra-cavity with the optical isolator.

Principle of Operation

According to the idea of the invention, spatial filtering of light 110 amplified by the LAM 120 that has been disposed in the EC 130 defined by mirrors 130A, as schematically depicted in FIG. 1, is rooted in the dual filtering provided by the system 134. (FIG. 1 illustrates the specific example of the EC 130 that includes a loop EC shaped as a polygon and formed by four mirrors 130A). Such dual filtering action includes the combination of (i) the spatial filtering of light by the optical etalon 140 disposed inside the external cavity 130 (and, generally, inclined at an angle α with respect to the optical axis 150 of the EC, as shown by an angle between the normal 140A to a operating surface of the etalon 140 and the axis 150) and (ii) the spatial filtering of light by the mirrors 130A of the EC 130. It is appreciated that in a specific case the value of α may be zero degrees. The principle(s) of operation of an embodiment of the invention can be appreciated from the following non-exhaustive list of considerations.

Spatial Filtering with Optical Etalon.

A multi-spatial mode light distribution that a given LAM is structured to amplify at a given free-space wavelength $\lambda_0$—in other words, the spatial spectrum of the LAM-generated—can be represented with a combination of spatial eigenfunctions, for example a multiplicity of plane-waves, each of which propagates through the LAM at a corresponding angle with respect to a chosen axis (for example, an optical axis defined by the axis of the LAM). A spatial filter that includes an optical etalon (in a simple case, a Fabry-Perot-etalon-based spatial filter) is configured, according to an embodiment of the invention, to modify such spatial spectrum by reducing the number of plane-waves in the multiplicity of plane waves incident upon the etalon. Depending on the choice of opto-geometrical parameters of a given optical etalon (such as its geometrical thickness and refractive index), only that plane wave incident onto the etalon continues to propagate upon interaction with the etalon, the constructive interference condition for which (either in reflection or in transmission, depending on the use of the etalon in the EC) has been satisfied. For example, for an optical etalon with the optical thickness of $n_E d_E$ (measured along an axis that is normal to a reflector of the etalon, such as the axis 140A of FIG. 1, where $n_E$ is the reflective index of the body of the etalon and $d_E$ is its geometrical thickness), the constructive interference condition for a plane-wave transmitted through the etalon is defined by $$\cos \theta_E = m\lambda_0 / 2n_E d_E \qquad (1)$$

where m is an integer and $\theta_E$ is an angle of the propagation of the plane-wave through the etalon with respect to the axis 140A. Accordingly, only plane-waves that are incident from the ambient with a refractive index $n_i$ onto the optical etalon at angles $\theta_1$ that satisfy Snell's law $n_i \sin \theta_1 = n_E \sin \theta_E$ are transmitted through the optical etalon. The spatial spectrum of light transmitted through the etalon is reduced as compared to the spatial spectrum of light that is incident upon the etalon. The spatial filtering function of an optical etalon operating in reflection can be assessed in a similar fashion. Therefore, the spatial spectrum of light that has interacted with the etalon is different from the spatial spectrum of light incident onto the etalon. According to an embodiment of the invention, an optical is specifically configured to spatially-filter some of the plane-waves representing a spatial spectrum of the light-output incident onto the etalon from the LAM and form a further-propagating distribution of light having a modified, first filtered spatial spectrum that is characterized by a number of plane-waves that has been reduced, as compared with the spatial spectrum of light amplified by the LAM, in accord with the defined spatial filtering function of the etalon.

In reference to FIG. 2A, the spatial filtering function of the optical etalon operating in transmission can be further expressed graphically. Defining β as a length of the projection of a wavevector representing a given plane-wave that satisfies the condition of Eq. (1), the first filtered spatial spectrum (i.e., the spatial spectrum of light that has transmitted through the etalon 140 and continues its circulation in the EC 130) is expressed as a function of spectral frequency of light ω, as a set of straight lines 210-1, 210-2, . . . 210-M (1, 2, . . . M being sub-indices of corresponding notations) each of which represents a particular plane wave constructively interfering in transmission through the etalon 140. The vertical line 220 represents a chosen frequency $\omega_0$ of monochromatic light amplified by the LAM 120, which corresponds to $\lambda_0$. Here, the outmost straight line 210-1 has a slope of inclination of 1/c with respect to the ω-axis (c denoting the speed of light in vacuum or air) and corresponds to a plane-wave incident onto the etalon 140 perpendicularly ($\theta_E$=0). Each of the discrete lines 210-2, 210-3, . . . 210-M has a corresponding slope of inclination that is smaller than 1/c, and represents, respectively, a particular plane wave that propagates through the etalon at a respectively corresponding angle $\theta_E$ under the condition of Eq. (1). The ellipses 230 indicate an intentional omission, for simplicity of illustration, of some of straight lines. The value $\Delta\beta=\pi/n_E d_E$ represents the equidistant separation, in β-space, between the adjacent transmission maxima of the optical etalon 140, while the values $\beta_{210-i}$ represent the values of β corresponding to plane-waves 210-$i$, i=1, 2, . . . M. It is appreciated that the number of plane-waves that the etalon transmits at a given spectral frequency $\omega_0$ is finite, and that integer m in Eq. (1) has a value of 1 for the plane-wave 210-M propagating at a largest angle with respect to the axis 140A as governed by Eq. (1), and that the highest value of m achievable according to Eq. (1) corresponds to the plane-wave 210-1.

Spatial Filtering with a Cavity Mirror.

According to an embodiment, spatial filtration of the spatial spectrum of the light-output of the LAM, caused the operation of the optical etalon of the embodiment of the invention, is further controllably advanced by appropriately dimensioning an operating surface of a mirror 130A of the EC to a target size (shown as A in FIG. 1) that is sufficient to remove at least one plane-wave component from the first filtered spatial spectrum, such that spatial distribution of light circulating in the EC 130 and amplified by the LAM 120 has a second filtered spatial spectrum. The number of plane-wave components representing the second filtered spatial spectrum is smaller than the number of plane-wave components representing the first filtered spatial spectrum.

A plane-wave that is filtered out by the EC-mirror from the first filtered spatial spectrum upon is characterized by an angle of propagation that exceeds a predetermined critical angle, which is a linear angle corresponding to a solid angle subtended by such mirror as viewed from the neighboring mirror, for example, as viewed from an edge of a neighboring mirror of the EC.

As a non-limiting example, suppose that a mirror of the EC is sized such that its extent corresponds to the predetermined critical angle forming, according to Snell's law, an angle $\theta_E$ that is smaller than the angle of propagation of the plane-wave 210-$j$ through the optical etalon 140 (where 2≤j≤M). Then, the overall spatial spectrum of light that remains in circulation within the EC 130 and that is amplified by the LAM 120 includes only plane-waves 210-1, 210-2, . . . 210-($j$-1). As another non-limiting example, suppose a mirror of the EC is sized such that its extent (when viewed from an edge of a neighboring mirror) is described with the predetermined critical angle corresponding, according to the Snell's law, to an angle $\theta_E$ that is smaller than the angle of propagation of the plane-wave 210-2 through the optical etalon 140. Then, as a result of combined spatial filtering of light with the intra-cavity optical etalon and with the EC itself, the spatial spectrum of light that remains in circulation within the EC 130, while being amplified by the LAM 120, contains only one plane-wave 210-1 that nominally propagates through the etalon along the normal 140A.

FIG. 2B provides a schematic diagram of the determination of such predetermined critical angle $\theta_{CC}$ (referred to as a cavity critical angle) that limits the direction of propagation of a plane-wave with respect to the optical axis 150, based on linear extent(s) of the EC 130. By virtue of the geometry of the EC 130, the largest angle at which a plane-wave can bounce off from one mirror 130A to another mirror 130A and still remain in the EC is defined by the angle $\theta_{CC}$. This angle of inclination, referred to as cavity critical angle, is formed between a line 244 that connects respectively corresponding outermost points of the neighboring mirror(s) 130A and the axis 150 of the EC and, in a simple case, is derived based at least in part on a ratio between the transverse size A of the mirror 130A and the length B of a segment of the EC. For example, the cavity critical angle of about 5 degrees requires B/A to be about 11. It is understood that in the case when, for a given EC, several such ratios can be defined (for example, in the case when the EC is not squarely shaped), then the cavity critical angle is defined by the smallest of the available ratios of mirror sizes to lengths of segments of the EC.

Figure 2C:
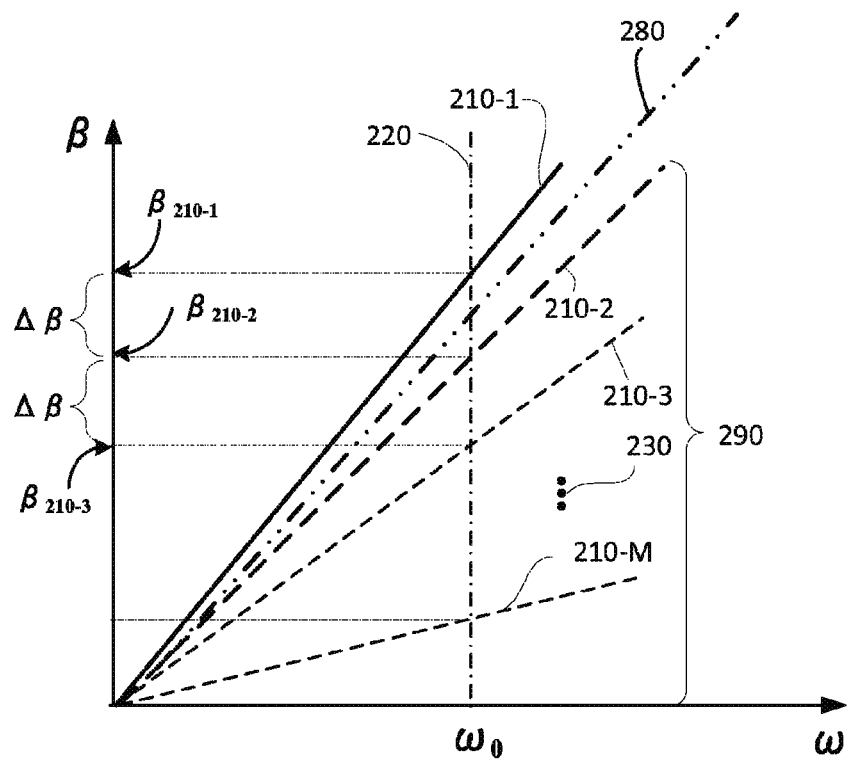
FIG. 2C is a plot schematically representing contents of the spatial spectrum of FIG. 2A as a result of spatial filtering provided by defining parameters of the external cavity of FIG. 1 according to the chosen cavity critical angle.

FIG. 2C in conjunction with FIG. 1 provides a graphical illustration of the principle of spatial filtering effectuated by dimensioning a mirror 130A of the EC 130 to a target size. Here, a straight light 280 represents a plane-wave having a wavevector defined with respect to the optical axis 150 by the cavity critical angle. The target size to which the mirror 130A is dimensioned is such that the slope of the line 280 in the β-vs.-ω plot of FIG. 2B is larger than the slope of the line 210-2 but smaller than the slope of the line 210-1. Accordingly, the EC 130 having a mirror 130A that has been sized to such target size will eliminate, from the first filtered spatial spectrum of FIG. 2A, all plane-waves but the wave propagating through the etalon along a nominal direction that normal to the etalon's reflector. The spatially-filtered-out-by-the-mirror plane waves are aggregately denoted as 290.

It can be shown that the maximum number $M_{max}$ of plane-waves representing spatial spectrum of light remaining in circulation within the EC (such as, for example, the EC 130 illustrated FIGS. 1 and 2B) as a result of spatial filtering by both the etalon 140 and the EC 130 is defined by an integer part of the division (i.e., the quotient) of $[1-\cos\theta_{CC}]^{-1}$. As an example, $M_{max}$=263 for $\theta_{CC}$=5°, $M_{max}$=66 for $\theta_{CC}$=10°, and $M_{max}$=3 for $\theta_{CC}$=45°.

While the combined operation of the two spatial filtering means discussed above—the one configured based on an optical etalon and another configured based on the sizing of a mirror of an external-cavity—has been illustrated by presenting a sequence of spatial filtering, it is understood that the aggregate filtering result (manifesting in the reduction of the number of plane-waves representing the initial spatial spectrum of light amplified by the LAM 120) stems from contemporaneous acts of spatial filtering of light by these two spatial filtering mechanisms, which acts can be considered in any order. Overall, the spatial spectrum of light collected as an output from the system 130 through a mirror 130A is defined by the second filtered spatial spectrum and is reduced, in a controlled fashion, as compared to the spatial spectrum characterizing light that LAM is structured to amplify.

Providing for Finite Directional Bandwidth.

It is appreciated that in practical situations both the finite spectral frequency bandwidth ($\omega_0 \pm \delta\omega$) of light generated by the LAM 120 and finite diffraction of this light that is present regardless of the spatial mode control in the EC may require broadening of the spatial filtering function of the optical etalon used in an embodiment of the invention. When an actual laser diode chip is used as the LAM 120, light propagating through the waveguiding active region of the laser-diode chip is caused to diffract—even in the case of the lowest, $TEM_{00}$ laser mode output—upon exiting the laser-diode chip, due to the finite transverse confinement within the waveguiding active region. In order to correlate the dual spatial filtering mechanism of the invention with such finite spectral and directional bandwidths of light and to reduce the loss of optical power in the light output, an embodiment of the system of the invention may be additionally configured to provide means for accommodating these finite bandwidths.

Figure 3:
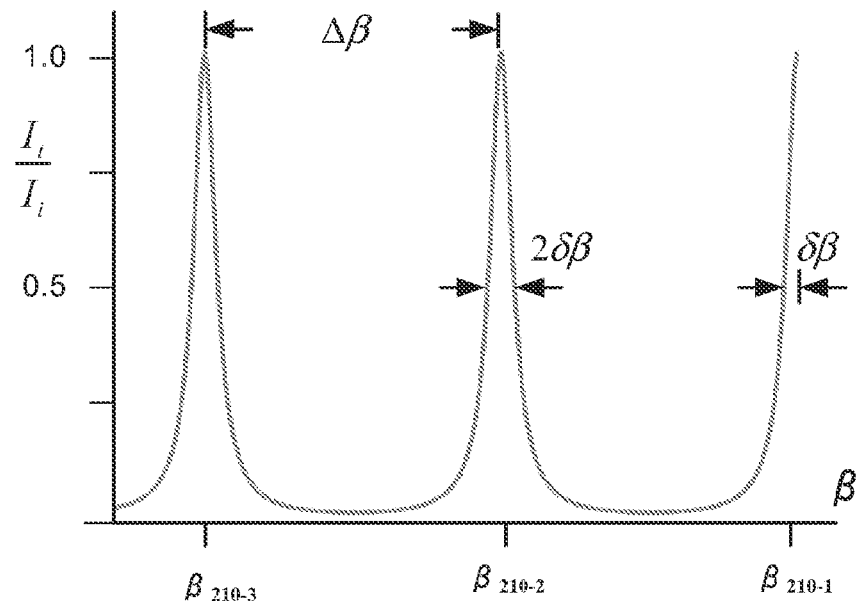
FIGS. 3 and 4 present plots illustrating finite directional bandwidth of the optical etalon according to an embodiment FIGS. 5A and 5B provide schematic illustrations to a structure of a conventional small-core laser diode chip.
Figure 4:
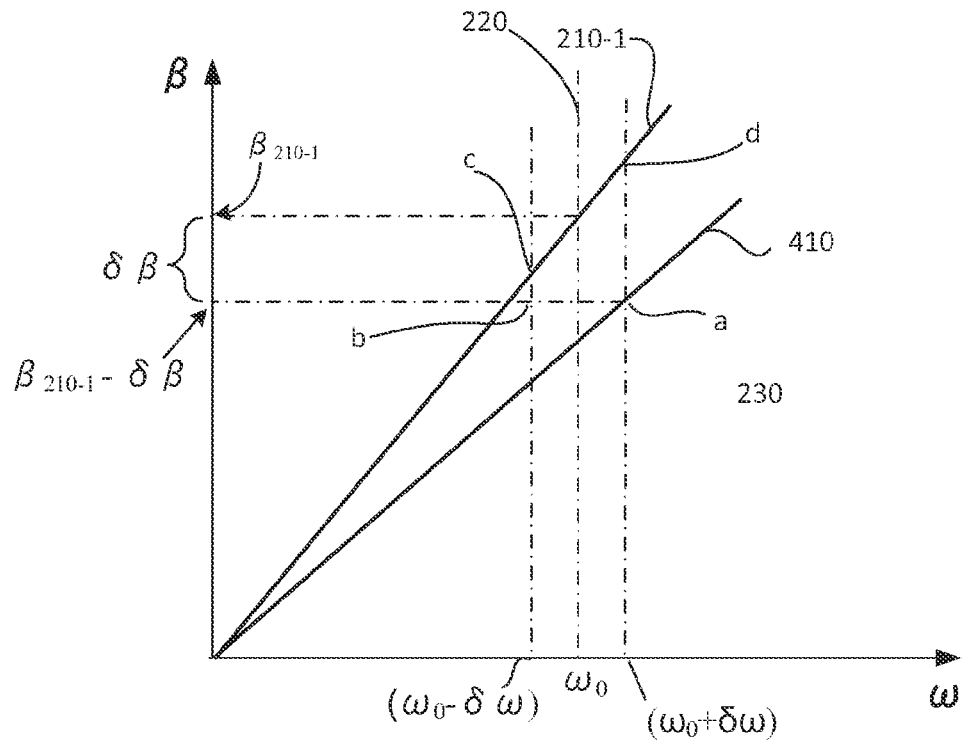

To this end, FIG. 3 in further reference to FIG. 2C represents a situation when the spatial spectrum of light incident on to the optical etalon 140 of the laser system 134 includes 3 plane waves. The etalon 140 further spatially filters this spectrum to retain, inside the EC 130, only the light the nominal direction of propagation of which through the etalon corresponds to a β-value of a point on the line 210-1. FIG. 4 presents a plot illustrating the resulting spatial spectrum of the system 134. As shown in both FIG. 3 and FIG. 4, the etalon 140 is additionally configured to have an acceptance angle accommodating both the finite directional bandwidth δβ of light 210-1 and its finite spectral bandwidth ($\omega_0 \pm \delta\omega$). Line 410 represents an angular deviation from the nominally perpendicular-to-the-etalon 140 direction of propagation of light remaining to circulate in the EC 130, which deviation is caused by diffraction of light at the facet of the LD chip of the system. The trapezoidal area defined, in FIG. 4, by points labeled as a, b, c, d represents plane waves (in terms of β and ω) that can circulate in the system 134.

If $\theta_d$ is an angle representing such angular deviation (as measured with respect to the axis 150) caused by finite spatial resolution of the optical-etalon-based spatial filter, it can be shown that $$\cos\theta_d/C = (\beta_{210-1} - \delta\beta)/(\omega_0 + \delta\omega) \quad (2)$$

For small values of δω and δβ and small angles of diffraction, the assessment of the angular deviation of Eq. (2) is reduced to $$\theta_d = \sqrt{2}[\delta\beta/\beta_{210-1} + \delta\omega/\omega_0]^{1/2} \quad (3)$$

where the figure of merit (FOM) representing angular acceptance (directional bandwidth parameter) of the etalon 140 can be assessed as $$\delta\beta/\beta_{210-1} = 1/(2MF) \quad (4)$$

Here, finesse F of the etalon is $$F = \Delta\beta/(2\cdot\delta\beta) = \pi\sqrt{R}/(1-R) = \pi\sqrt{Q_R}/2 \quad (5)$$

where $Q_R = 4R/(1-R)^2$ is an etalon quality factor (associated with the reflectance values R of its mirrors and expressed for an etalon with equal-reflectance mirrors). The contribution of the finite spectral bandwidth of light into the angular deviation parameter $\theta_d$ of the optical etalon is defined by the combination of gain characteristics of the LD chip and the seed laser, when used.

It is appreciated that, in practice, matching of the values of the angular deviation parameter of the optical etalon with the value of angle of diffraction of light emanating from the LD chip is preferred. As an example, the angle, at which light at a wavelength of 1 micron diffracts at the facet of the active region with a dimension of 100 microns, is about $\theta_D=0.57$ degree. Based on Eqs. (1), (3), (5) and assuming a typical value of δω of about 100 MHz, the value of $\delta\beta/\beta_{210-1} \sim 10^{-4}$ required to achieve a condition of $\theta_d = \theta_D$ will be obtained with the use of an etalon with $n_E=1$ and $d_E$ of about 100 microns for F of about 50 and the value of M, corresponding to the plane-wave 210-1, of about 200.

EXAMPLES OF EMBODIMENTS

The principle of spatial filtering according to embodiment discussed above is implemented in structuring an embodiment of the laser system around an LD chip which, when operating in a laser-diode regime, provides a light output including multiple spatial modes. A laser system utilizing such LD chip can be configured according to an embodiment of the invention such as to produce light output containing, for example, only the lowest spatial mode.

Figure 5B:
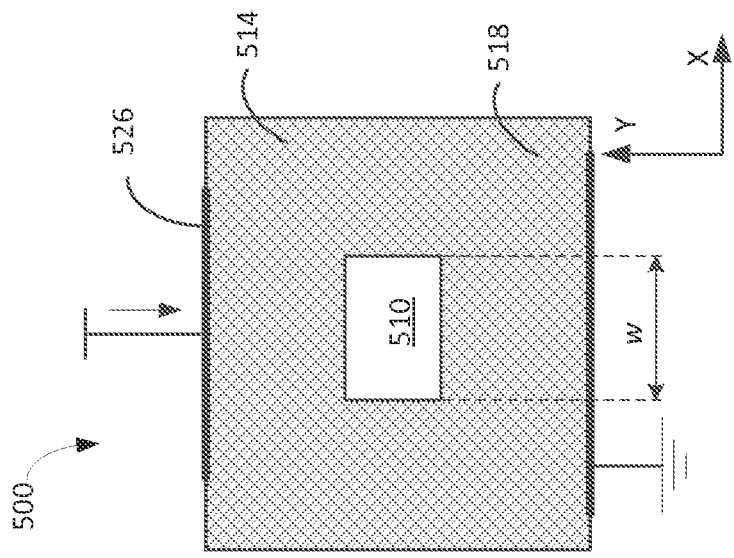
Figure 5A:
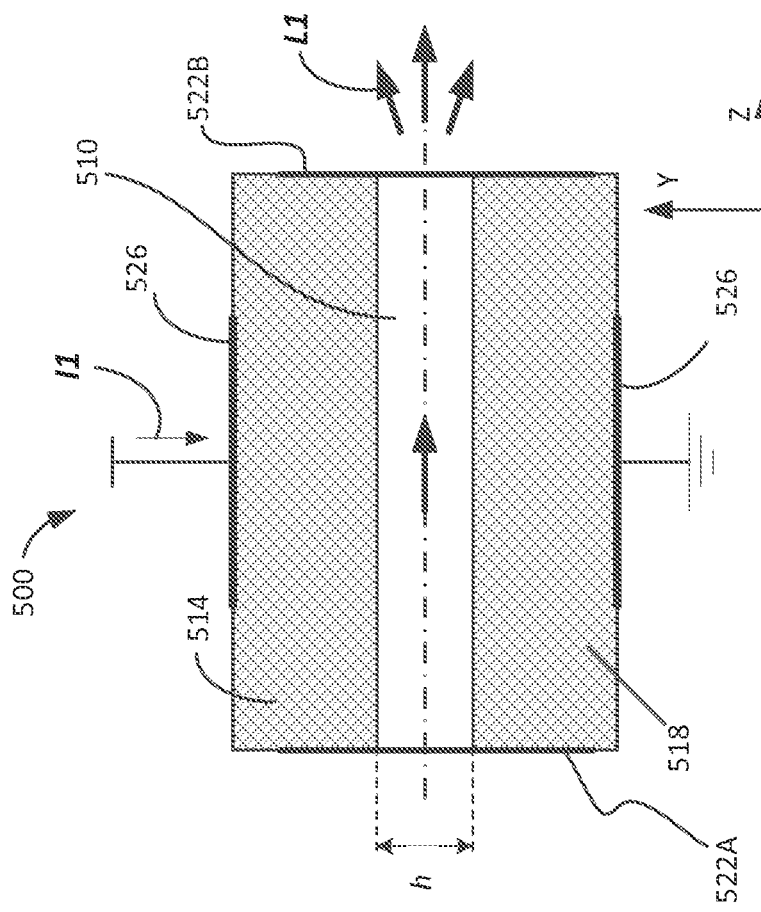

FIGS. 5A and 5B provide a simplified schematic, in side and front view, respectively, of a conventional (small-core) buried double heterojunction (DH) LD 500 having an active core or region 510 (such as, for example, $In_{1-X}Ga_XAs_YP_{1-Y}$ core) with dimensions of height h on the order of 0.1 μm and width w on the order of 1 μm. The core 510 is disposed between the p- and n-doped structures 514 and 518 of InP. For simplicity of illustration, some structural details facilitating transverse confinement of carriers and/or photons are not shown. The cavity with length l on the order of 200 μm, of the chip of the LD 500, is defined by reflectors 522A, 522B (which may be, for example, a high-reflectance mirror and a low-reflectance mirror, as known in the art). For the purposes of this disclosure, the transverse dimensions along the y-axis and the lateral dimension along the x-axis, as shown, may be interchangeably referred to herein as vertical and horizontal dimensions, while a dimension along the cavity (i.e., along the z-axis as shown) may be referred to as a longitudinal dimension. An example of operational parameters is provided by generation of light output L1, in the lowest transverse mode, at a wavelength λ of about 1 μm with power of about 10 mW at an injection current I1 of about 100 mA, provided between electrodes 526 (at operational temperature T of about 20° C.), and with a threshold current $I1_{thr}$ of about 20 mA.

Figure 6B:
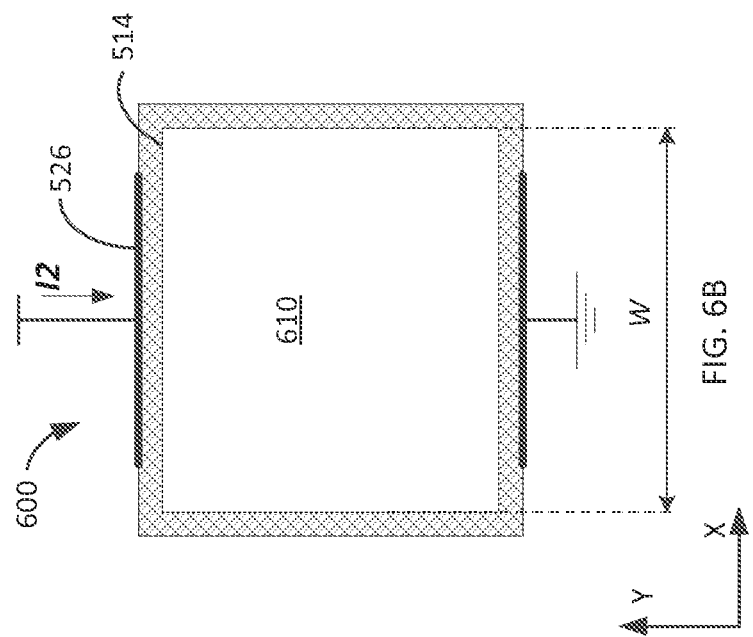
FIGS. 6A and 6B provide schematic illustrations of a structure of a large-core chip of amplifying medium for use in an embodiment of the present invention.
Figure 6A:
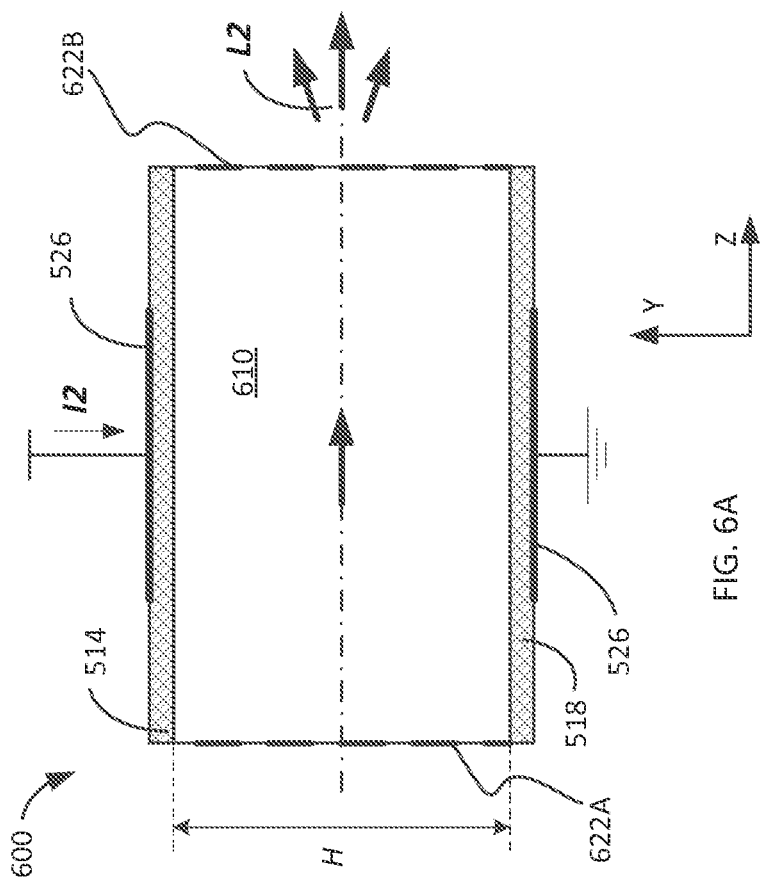

In comparison, the schematic side- and front-view diagrams of a large-core LD chip 200, for use in embodiments of the invention, are shown in FIGS. 6A and 6B. Again, for the simplicity of illustration the detailed structure of the LD chip is omitted. Material parameters of the LD chip 600 are the same as those of the LD 100, with the cavity length l (defined between the facets optionally coated with coatings 622A, 622B) chosen to be equal to that of the chip 500, while the transverse dimensions W, H of the large active core 610 are such that its area is at least one order of magnitude larger or even more than one order of magnitude larger (for example, 1000 times larger) than the area of the LD 500 of FIGS. 5A, 5B. A large-core LD chip is defined, for the purposes of this disclosure, in a similar fashion as a LD chip with an active core having a cross-sectional area that, when measured across the axis of the chip, exceeds the area of the active region of a typical, commercially-available LD configured to generate a single-transverse mode light output by at least an order of magnitude or more. In one embodiment, both W and H are several microns or larger (for example, 10 microns). While active region 610 is illustrated as a channel waveguiding structure, it's appreciated that it can be structured differently as known in the art, for example as a slab waveguide.

When the chip 600 is structured for operation in an external cavity (such as the cavity 130 of FIG. 1, for example), at least one of the coatings 622A, 622B may be judiciously chosen to be an AR-coating structured to reduce losses on reflections of light intra-cavity. In this case, the threshold injection current $I2_{thr}$ is estimated to be on the order of several Amperes (or even between about 10 A and about 20 A), while the operational current I2 is estimated to be several tens of Amperes (for example 100 A). It is appreciated that, due to a substantially complete overlap between a lasing mode and the spatial distribution of current in the active region of the LD 600 (which is substantially larger than such overlap in a small-core 510, known to be only about 20%), the chip 600 in an embodiment of the invention is expected to operate with much higher carrier-to-photon energy transfer efficiency (5 times as high) due to an almost complete photon-carrier overlap.

It is appreciated that without judicious spatial mode control, a large-core LD such as the LD 600 generates a low-quality output beam (having lots of transverse modes in it), which limits practical usefulness of such LD in comparison with the single-spatial-mode output generated by a conventional small-core LD such as the LD 500. Unlike the single-mode output of the LD 500, the light output of the LD 600 contains a complex combination of irradiance patterns and cannot be collimated to form a distribution with a substantially plane wavefront.

According to an embodiment of the invention, the large active region LD chip (such as the chip 610, for example) is used for lasing in a judiciously structured EC that is defined by at least three mirrors and that is formed as a loop cavity in which the optical path of light circulating within the EC starts and ends at the same location. While specific examples of embodiments provided below are referencing planar loop ECs (in which optical paths of intra-cavity circulating light is defined by a polygon formed, for example, in yz-plane), it is appreciated that, generally, a loop EC of the present invention can be structured as a loop extending in all three dimensions. For example, while several segments of such loop may be defined in the yz-plane, other segments may have a corresponding x-axis component.

Figure 7A:
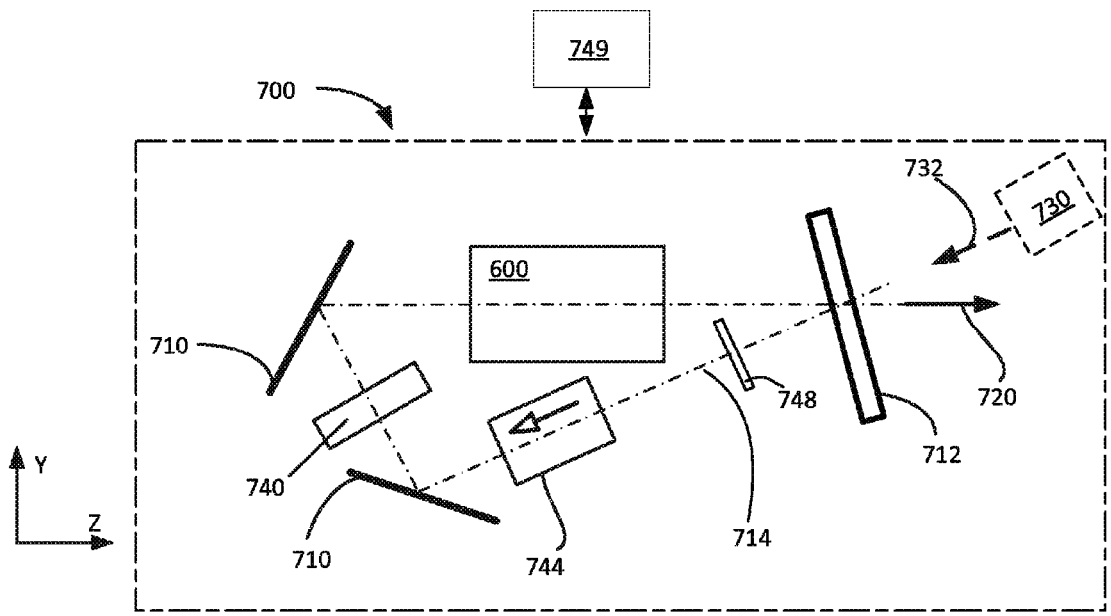
FIGS. 7A and 7B are diagrams illustrating embodiments of a laser system of the invention structured with external cavities defining triangular optical paths.
Figure 7B:
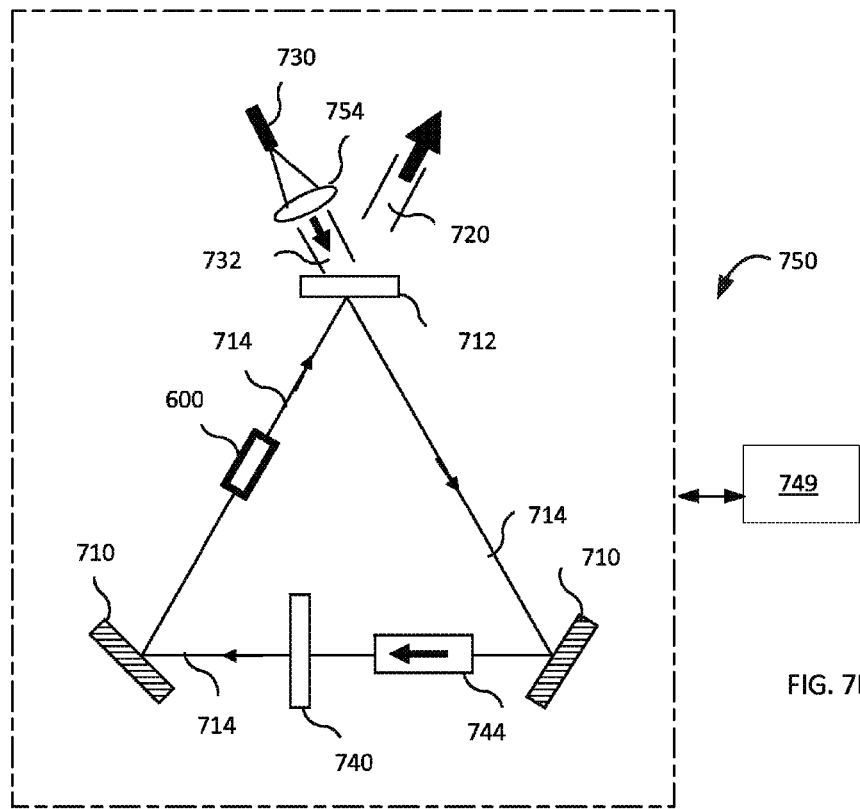
Figure 8:
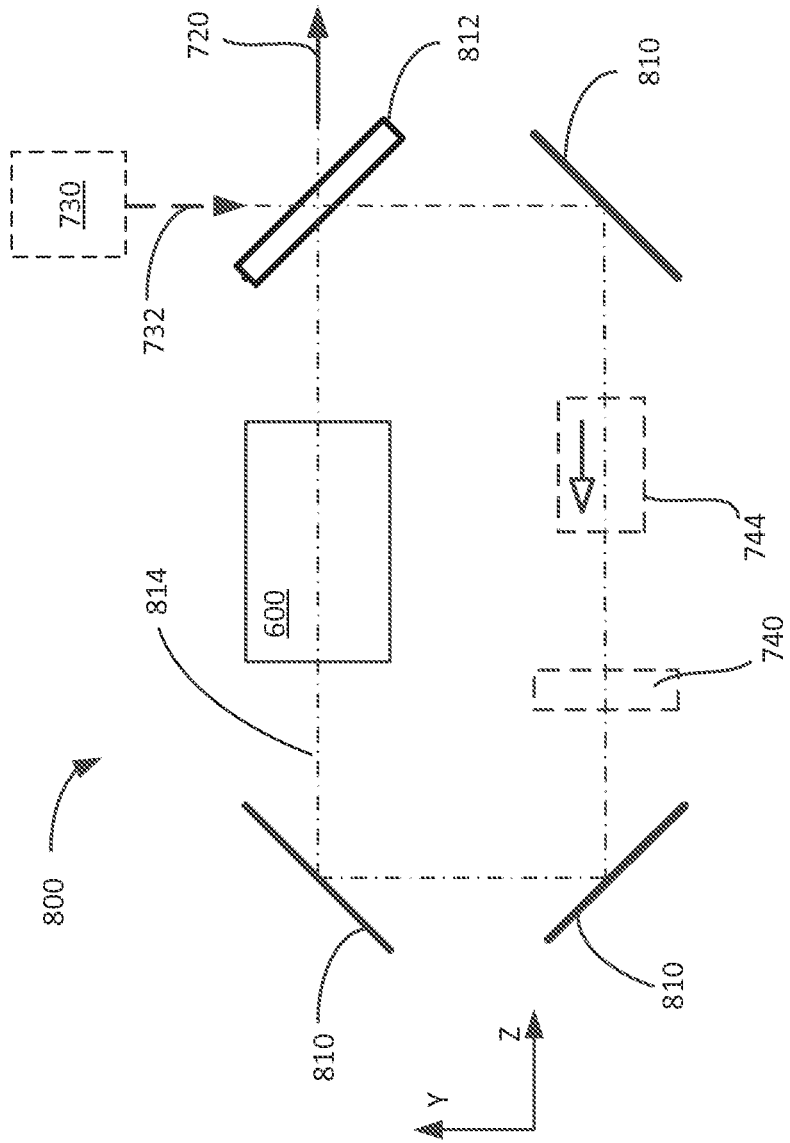
FIG. 8 is a diagram illustrating an embodiment of a laser system of the invention structured with an external cavity defining a rectangular optical path.

Some examples of the LD system structured according to the idea of the invention are schematically illustrated in FIGS. 7A, 7B and 8. A diagram 700 of FIG. 7A, for example, presents a polygonally-shaped EC defined by three mirrors 710, 712 that designate an intra-cavity optical path 714 in the yz-plane. As shown, the optical path 714 forms a triangle (which, in a specific case, may be configured as an equilateral or even an isosceles triangle). Two mirrors 710 have high reflectance values at the chosen operational wavelength (for example, they can be substantially totally reflective, as understood in the art), while the mirror 712 is partially transmissive and is configured as an output mirror through which, in operation, light output 720 is acquired. The facets of the LD chip 600 that are transverse to its axis may be AR-coated to reduce optical losses intra-cavity.

The EC LD-system 700 may be complemented with an external (with respect to the EC cavity) injection seeder or seed laser 730 configured to direct light, when required, along the optical path 714 through the LD chip 610 to stabilize and/or predetermine the frequency spectrum of the light output 720. The seed laser 730 includes a stable, single-frequency laser configured to emit seed light 732 within the gain-bandwidth of the gain medium of the chip 610 to facilitate a single longitudinal (spectral) mode of operation thereof. Furthermore, according to an idea of the invention, the system 700 is equipped with an optical etalon 740 (such as, for example, a Fabry-Perot Etalon) and, optionally, with an optical isolator 744 appropriately disposed intra-cavity to ensure that intra-cavity circulation of light along the path 714 occurs only in one direction. It is appreciated that the presence of the isolator 744 may be preferred when the inclination of the etalon 740 with respect to the optical axis 714 (i.e., angle $\alpha$) is very small or substantially zero. The use of the optical isolator in this may facilitate one or more of the improvement of the quality of the output beam 720 and the level of output power in the output beam by preventing light reflected by the etalon 740 from propagating in the EC. In the case when the value of $\alpha$ exceeds a critical value that depends on the geometrical parameters of the EC, the need in the optical isolator 744 in the EC is reduced. Moreover, a polarization filter (optical polarizer, not shown) can be additionally optionally disposed intra-cavity in a specific implementation. It is understood, however, that the general principle of operation of the invention is not predicated on the presence of the isolator 744, the polarizer 748, or the seed laser 749, nor does it depend on in which segment of the optical path 714 any of these components is optionally installed. Furthermore, while the optical etalon 740 is shown to operate in transmission, in a related embodiment (not shown) the EC may be equipped with an intra-cavity etalon structured to operate in reflection, as would be understood by a skilled artisan. Optionally, an operational connection can be established between the system 700 and electronic circuitry 749 such as a computer processor, specifically programmed to govern various parameters of operation of the system 700 (such as, for example, to vary pump current for the chip 610, tune the etalon 740, tune the wavelength of the seed laser 730, control the clear aperture of a mirror of the EC by varying the size of a hard aperture juxtaposed thereto, and/or oversee the change of other operational parameters of the system as well as to collect and process data, as discussed below).

FIG. 7B shows a variant 750 of the embodiment of FIG. 7A, in which the EC is configured to define an equilateral triangle. The lens 754 is explicitly shown to indicate that the seed light 732 from the seed laser 730 is pumped into the EC in a form of a substantially collimated beam.

FIG. 8 shows a diagram of a related embodiment 800, in which a rectangular EC defining a rectangular optical path 814 in the yz-plane is formed with four mirrors 810, 812, of which the mirror 812 is configured as an output mirror. Here, while the optical etalon 740 and optical isolator 744 are shown, the optional intra-cavity polarizer and an operable connection to the programmable processor 749 are not indicated for simplicity of illustration.

Configuring the FPE 740 and the dimensions of the mirror(s) 810, 810 as discussed above, each of the laser systems 700, 750, 800 can be configured . . . to support and output only the $TEM_{00}$ mode, the mirror(s) of the EC should be configured such that the cavity critical angle is smaller than angles of next and higher FPE transmission maxima.

Example 1

Parameters of the system 800 may include: cavity length of about 12 cm; cavity width of about 10 cm; mirror(s) dimensioned to have a clear aperture with transverse size of about 1 cm, resulting in a cavity critical angle of about 4.8 degrees, defining the value of $M_{max}$ of 287; and the output mirror with reflectance of about 90%. The seed laser 730 (and, therefore, the whole laser system) is chosen to operate at a wavelength of about 920 nm with the spectral bandwidth of about 100 MHz, with the output power of about 1 mW. The LD chip 610 is characterized by a band gap of about 1.2 eV and is structured to amplify light at the operational wavelength of about 920 nm (substrate material=InP; active core material $In_{1-X}Ga_XAs_YP_{1-Y}$ with x=0.095 and y=0.21; core length of about 1000 microns; core width of about 10 microns; core height of about 10 microns).

Considering the above parameters, the optical etalon 740 is configured to ensure that the number M corresponding to plane-waves representing its spatial filtering characteristic is lower than $M_{max}$, (for example M=200), for example to have a thickness of about 92 microns, reflectance values R of the etalon mirrors of about 94%, finesse F of about 50, and the directional bandwidth of about 0.57 degrees that accommodates the angle of diffraction of the lowest order mode of the LD 600. The same FP etalon is well suited to operate as a diffraction-accommodating spatial filter for a large-core LD chip, the cross-section of the active region of which is 100 um×100 um or less.

The optical isolator may be chosen to introduce insertion losses not exceeding about 10%. The assessed output and operational characteristics of the LD system of this example include: optical power output of about 100 W at the operational current of about 100 A or lower. It is appreciated that when the operational wavelength of the laser-diode based system of the invention is different from 920 nm used in this example, the thickness of the optical etalon-based spatial filter of the invention should be appropriately adjusted.

Example 2

Parameters of the system 750 may include: an EC length of about 20 cm, mirrors with clear apertures of about 1 cm in dimension, cavity critical angle of about 2.9 degrees (which corresponds to $M_{max}$ of about 800), and the output mirror 720 having a reflectance value of about 90%. The seed laser 730 (and, therefore, the laser system as a whole) is chosen to operate at a wavelength of about 920 nm and spectral bandwidth of about 100 MHz, with the output power of about 1 mW. The LD chip 610 is characterized by a band gap of about 1.2 eV and is structured to amplify light at the operational wavelength of about 920 nm (substrate material=InP; active core material $In_{1-X}Ga_XAs_YP_{1-Y}$ with x=0.095 and y=0.21; core length of about 1000 microns; core width of about 30 microns; core height of about 30 microns).

Considering the above parameter, the optical etalon 740 is configured to ensure that the number M corresponding to plane-waves representing its spatial filtering characteristic is lower than $M_{max}$, (for example M=200), for example to have a thickness of about 92 microns, reflectance values R of the etalon mirrors of about 94%, finesse F of about 50, and the directional bandwidth of about 0.57 degrees that accommodates the angle of diffraction of the lowest order mode of the LD 600. The same FP etalon is well suited to operate as a diffraction-accommodating spatial filter for a large-core LD chip, the cross-section of the active region of which is 100 um×100 um or less. The optical isolator may be chosen to introduce insertion losses not exceeding, for example, about 10%. The assessed output and operational characteristics of the LD system of this example include: optical power output of about 900 W at the operational current of about 900 A or lower.

While FIGS. 6A, 6B illustrate the active region 610 of the LD chip 600 as being confined in both transverse and lateral directions, such illustration is purely schematic and it is understood that, for example, the waveguide confinement along at least one of the x- and y-axes may not be necessary. In this case, the active region of the chip 600 used in a laser system of the present invention would be structured not as a channel waveguide but as a slab-waveguide or even a substantially bulk element. It is also understood that generally, according to the idea of the invention, in a large-core LD chip such as chip 600 no spatial structure may be required for at least one of the electrical carrier and/or photon confinement. The power output provided by an embodiment of the invention can be scaled up by, for example, increasing the size of the core 610, which is understood to be limited by practicality and currently existing operational limitations on a semiconductor crystal growth. In practice, temperature to which the LD chip of the embodiment of the invention is heated up may provide a practical limitation on scaling of light output generated by the embodiment, as operation of a typical InGaAsP-based LD is associated with an operational temperature generally not exceeding about 100° C. (An addition of an appropriate cooling structural layer (such as that discussed at http://www.rp-photonics.com/diode_stacks.html) may be used to alleviate heating. It is appreciated that large-core chips can be, if desired, organized in arrays and/or stacks.)

In a specific implementation, the optical etalon filter and/or the seed laser can be made tunable, as known in the art, to achieve a higher degree of precision in generating the light output at a desired wavelength and higher flexibility in controlling a degree of spatial filtering of light intra-cavity.

Figure 9:
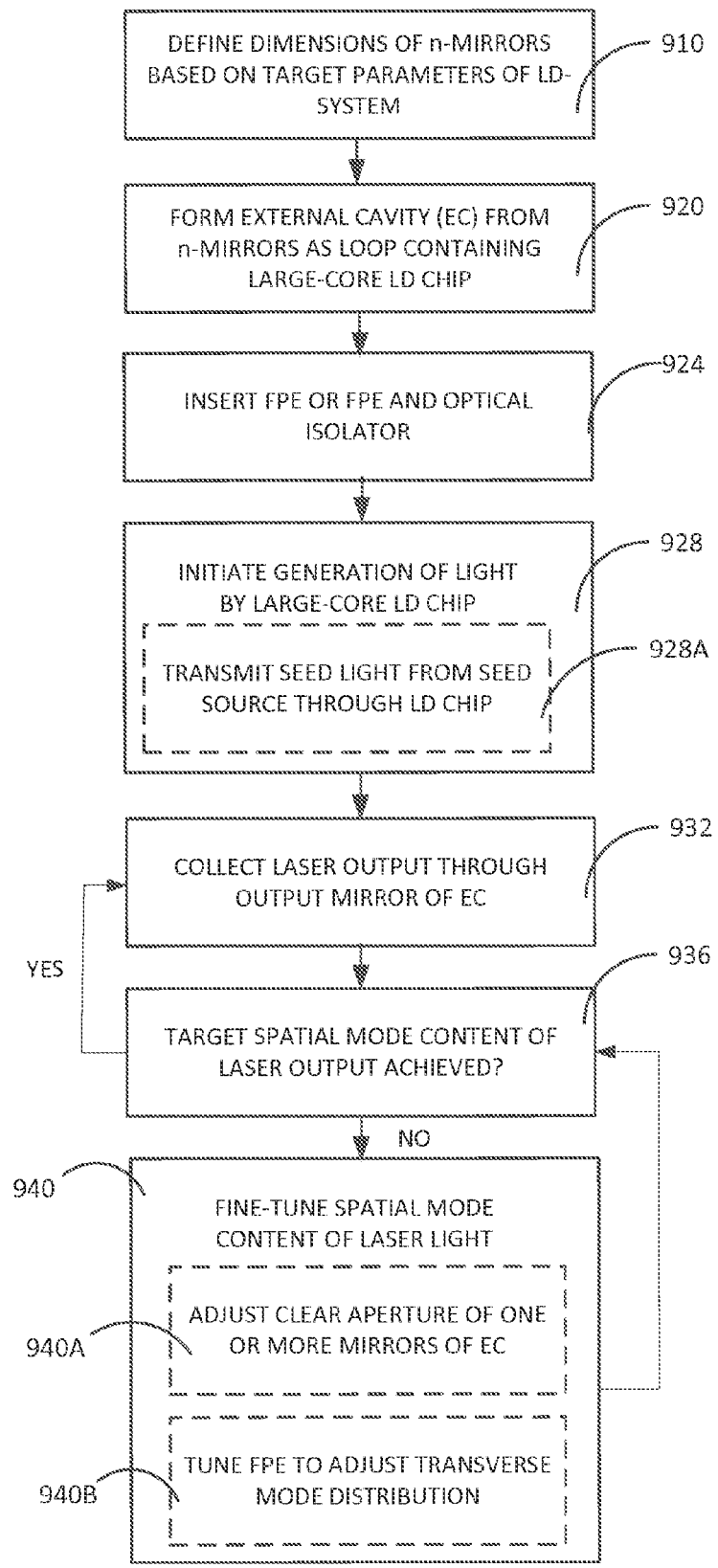
FIG. 9 is a flow-chart illustrating an embodiment of a method of the invention.

An example of a method for control of light generated with the use of a large-core LD according to an embodiment of the invention is schematically illustrated with a flow-chart of FIG. 9. The process of defining an EC-laser system includes a determination, at step 910, of dimension(s) of mirror(s) of the EC based at least on target parameters of the LD-based system (which depends, in turn, at least on parameters of the utilized large-core LD chip and the seed laser unit) and structuring an EC from the chosen mirrors around the large-core LD chip at step 920, followed by insertion of the optical etalon with predetermined parameters and, optionally, an optical isolator and/or the optical polarizer across the optical axis of the EC at step 924. The so-structured EC LD-system is further caused to generate light as known in the art, at step 928, by for example feeding electrical power to the LD-chip and fine-tuning of spatial orientation of the EC mirrors. The start-up of light generation in the system can be complemented by optionally coupling a beam of seed-light from the seed laser into the EC at step 928A and adjusting such seed-beam to propagate through the LD-chip substantially co-axially with the optical axis of the EC. The controllable adjustment of spatial content of light-output collected from the system at step 932 is effectuated if such spatial content does not satisfy the target spatial spectrum, as estimated at step 936. In this case, the spatial mode content of the light output can be tuned by modifying a size of a clear aperture of a mirror of the EC and/or tuning the optical etalon, 940A and 940B.

Figure 10:
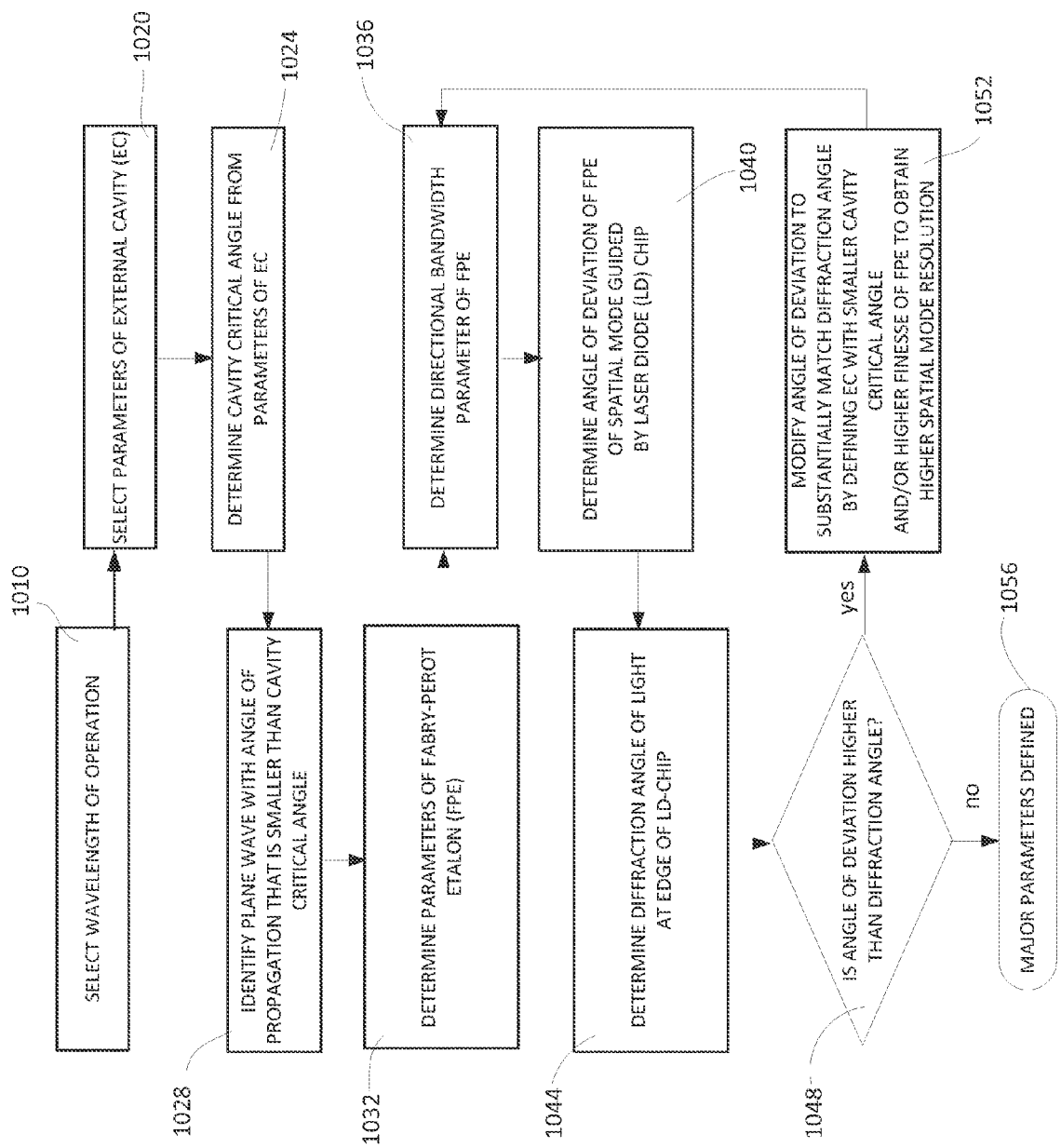
FIG. 10 is a flow-chart illustrating a related embodiment of the method of the invention.

A related method is illustrated in FIG. 10, starting with the selection of a desired wavelength of operation and determination of parameters of the EC (such as mirror size(s), length of segments etc) based at least in part on such selection, at steps 1010 and 1020. The cavity critical angle is being determined at step 1024, and a plane-wave having a desired angle of propagation with respect to the optical axis of the EC that is smaller than the cavity critical angle is identified at step 1028. Parameter(s) of the optical etalon based spatial filter of the laser system of the invention, such as optical thickness, for example, are then determined at step 1032, based at least on the wavelength of operation, an identifying parameter (such as $M<M_{max}$, for example) of the plane-wave chosen at step 1028, and finesse of the etalon. Additional spatial filtering characteristics of the etalon such as a directional bandwidth parameter and an angle of deviation can then be determined at steps 1036, 1040. Depending on the results of comparison, at step 1048, of the angle of deviation with an angle of diffraction of light occurring at the terminating surface of the LD amplifying medium, that has been assessed at step 1044, fine-tuning of the spatial-filtering FOM of the laser system may be required to achieve Such fine tuning is carried out, at step 1052, by at least one of modifying the critical cavity angle (which, in turn, can be achieved by varying a length of the segment of the EC and/or changing the size of the clear aperture of an EC-mirror) and/or employing an optical etalon with different finesse.

It is understood, therefore, that a high-power, lowest-order spatial mode laser system is realized based on a large-core LD medium operated in an EC the parameters and auxiliary optical elements of which are judiciously chosen according to consideration disclosed herein. Practical advantages of such system in comparison with, for example, a device incorporating a small-core laser-diode stack (or bar) are many, including:

- simplicity of the structure of the used LAM, which does not require any substantial or precise waveguiding structure in either transverse, lateral, or longitudinal directions as compared with a specific and precise structure of the small-core LD, requiring a precise control of the crystal-growth process;
- ability to control the spatial spectrum and/or wavelength of generated light with means that are external to the LAM as compare with, for example, the use of transverse and periodic longitudinal structures that have to be predetermined within the small-core LD itself;
- high degree overlap between electric carrier distribution and photon distribution in the LAM (as compared with a large portion of photons present outside of the active region of the small-core LD);
- the ability to scale power output by simply increasing the size of the LAM-medium (as compared with limited power output provided by the small-core LD).

Figure 11:
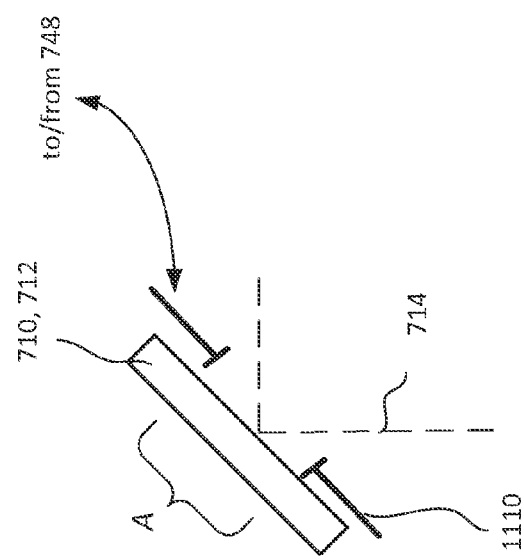
FIGS. 11 and 12 provide diagrams illustrating examples of modifications of embodiments of the invention.
Figure 12:
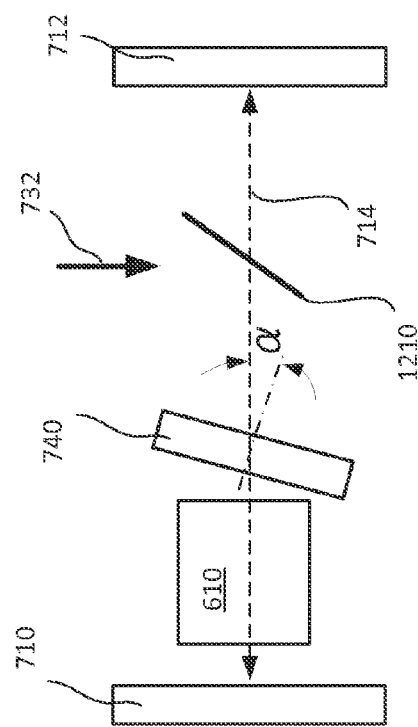

Using examples of embodiments, a laser system and method of the present invention have been described. While specific structured and descriptive values chosen for these embodiments are recited, it is to be understood that, within the scope of the invention, the values of at least some of the operational parameters and/or structures may vary to suit different applications. For example, control of a size of a mirror in the EC of the invention can be provided in real time, during the operation of the laser system of the invention, with the use of an adjustable aperture 1110 (such as an iris diaphragm, for example) juxtaposed with the operational surface of the mirror, as shown schematically in FIG. 11. Manual or computer-controlled variation of the opening A of such aperture facilitates modification of the clear aperture of the mirror without replacement of a mirror. In another modification, the EC can be structured such that at least two of the segments of the EC extend outside of a plane in which the remaining segments are. For example, the positions of all but one mirror of the EC have an x-coordinate of zero (such that all but one segments of the optical path of the EC are in yz-plane). In this case, the optical path through the EC defines a closed loop that is not a polygon as it extends in all three Cartesian dimensions to form three-dimensional figure that is bounded by a finite chain of straight line segments closing in a loop such as to form a closed chain. In another related embodiment, the laser system can be structured with the use of a linear EC as shown in FIG. 12, which contains an optical etalon inclined with respect to the cavity axis and to which the seed light 732 is delivered via a beamsplitter 1210.

Embodiments have been described as including a processor controlled by instructions stored in a tangible, non-transient memory including, but not limited to, on-writable storage media (e.g. read-only memory devices within a computer, such as ROM, or devices readable by a computer I/O attachment, such as CD-ROM or DVD disks), writable storage media (e.g. floppy disks, removable flash memory and hard drives). Alternatively, the instructions may include information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, it is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

The invention as recited in claims appended to this disclosure is intended to be assessed in light of the disclosure as a whole. Disclosed aspects, or portions of these aspects, may be combined in ways not listed above. Accordingly, the invention should not be viewed as being limited to the disclosed embodiment(s).

What is claimed is:

1. A method for controlling a transverse distribution of light generated by a light-amplifying medium (LAM) at an operational wavelength, the method comprising:
    operating said LAM within an external cavity (EC), which is configured as a loop cavity, such as to produce a first light output at said operational wavelength,
        said loop cavity being defined by at least three mirrors at least one of which is dimensioned to ensure that a first angle is smaller than a second angle, and
    impinging said light generated by the LAM onto an optical etalon filter disposed intracavity across a cavity axis between first and second mirrors of the at least three mirrors,
    wherein the first angle is defined as an angle formed between
        a cavity line, that connects (i) a first point defined on a perimeter of a clear aperture of a first chosen mirror of said at least three mirrors with (ii) a second point on a perimeter of a clear aperture of a second chosen mirror of said at least three mirrors, and a portion of an optical axis of said EC that connects said first and second chosen mirrors, and wherein the second angle is determined based on a non-zero angle at which said light generated by the LAM, that is incident on said optical etalon filter from the first mirror, constructively interferes with itself upon interaction with the optical etalon filter such as to propagate towards the second mirror.

2. A method according to claim 1, further comprising transmitting light from a seed laser source located outside the EC through the LAM along said cavity axis.

3. A method according to claim 2, wherein said transmitting includes tuning an operational wavelength of said seed laser source.

4. A method according to claim 1, further comprising transmitting light, generated by said LAM operated within the EC, through an optical isolator positioned between two mirrors of the EC.

5. A method according to claim 1, further comprising varying a clear aperture of one or more of the at least three mirrors.

6. A method according to claim 1, wherein said operating includes one of (i) operating a large-core laser diode (LD) chip within the EC that has been configured as a polygon, and (ii) operating a large-core LD chip within the EC that has been configured as a loop having extent in each of three dimensions.

7. A method according to claim 1, wherein said operating includes operating a large-core laser diode (LD) chip under chosen operating conditions within said EC such that the first light output includes a laser output containing a first number of transverse modes, wherein the first number is smaller than a second number of transverse modes generated by a laser diode that includes said large-core LD chip and that is operated under said operating conditions without EC.

8. A method according to claim 1, wherein said impinging includes transmitting said generated light through an optical etalon filter disposed intracavity with a reflector of said optical etalon filter being perpendicular to the cavity axis and transmitting said light through an intra-cavity optical isolator.

9. A method according to claim 1, wherein said impinging includes impinging said light generated by the LAM onto an optical etalon structured such that first spatial spectrum of first light, which has been formed as a result of interaction of said light generated by the LAM with said optical etalon, is different from spatial spectrum of said light generated by the LAM.

10. A laser system configured to generate first light at an operational wavelength, the laser system comprising:

a loop optical cavity formed by at least three mirrors, said loop optical cavity having an optical axis;

a light amplifying medium (LAM) disposed coaxially with said optical axis inside said loop optical cavity such that said loop optical cavity forms an external cavity (EC) with respect to said LAM;

and an optical etalon filter disposed intra-EC across the optical axis, wherein one or more mirrors of said at least three mirrors is dimensioned to ensure that a first angle is smaller than a second angle, wherein the first angle is defined as an angle formed between a cavity line, that connects (i) a first point defined on a perimeter of a clear aperture of a first mirror of said at least three mirrors with (ii) a second point on a perimeter of a clear aperture of a second mirror of said at least three mirrors, and a portion of the optical axis that passes through said first and second mirrors, and wherein the second angle is determined based on a non-zero angle at which light, that is incident on said optical etalon filter intracavity from the first mirror, constructively interferes with itself upon interaction with the optical etalon filter such as to propagate towards the second mirror.

11. A laser system according to claim 10, wherein said optical etalon filter includes a tunable Fabry-Perot Etalon (FPE) and further comprising a tuner operably connected to said FPE and configured to change an optical length of said FPE.

12. A laser system according to claim 10, further comprising a seed laser configured outside of the EC to generate a beam of light at the operational wavelength such that, when said beam of light is coupled into the EC, said beam of light propagates through the LAM along said optical axis.

13. A laser system according to claim 12, further comprising a computer program product for use on a computer system configured to control operational characteristics said laser system, the computer program product including a tangible non-transitory computer usable storage medium having computer readable program code thereon, the computer readable program code containing one or more of program code for varying a parameter of electrical feed supplied to said LAM;

program code for controlling an optical parameter of said optical etalon filter, said optical etalon filter structured to ensure that first spatial spectrum of first light, which has been formed as a result of interaction of said light generated by the LAM with said optical etalon, is different from second spatial spectrum of said light generated by the LAM; and program code for controlling an operational parameter of the seed laser.

14. A laser system according to claim 10, wherein said loop optical cavity either forms a polygon or is configured to have extent in each of three dimensions.

15. A laser system according to claim 10, further comprising an optical isolator disposed across the optical axis.

16. A laser system according to claim 10, further comprising an element positioned outside said EC such as to intercept said first light that has been delivered outside said EC.

17. A laser system comprising:

a large-core laser diode (LD) chip disposed in an external cavity (EC) defined by at least three mirrors;

an optical etalon and an optical isolator positioned in said EC;

a seed laser configured outside of said EC such as to transmit light that has been generated at an operational wavelength by the seed laser through a seed mirror of said at least three mirrors and through said LD chip;

wherein said LD chip is configured to generate light that contains N transverse modes at said operational wavelength when operated without EC;

wherein said EC forms a closed loop; and wherein said EC is configured such that
light at the operational wavelength that is incident from a first mirror onto said optical etalon at a largest angle, at which such is supported to circulate in the EC, does not propagate towards a second mirror of the EC upon interaction with said optical etalon;
and,
when operating at said operational wavelength, said laser system generates light forming a light output that contains M transverse modes, M<N.

18. A laser system according to claim 17, further comprising a polarizer disposed across said optical axis inside the EC.

19. A laser system according to claim 18, wherein said optical etalon is configured to have a variable optical length defined along a line normal to a reflector of said etalon.

20. A laser system according to claim 17, wherein said seed laser includes a tunable laser.

* * * * *